(12) United States Patent
Cheng et al.

(10) Patent No.: US 6,649,538 B1
(45) Date of Patent: Nov. 18, 2003

(54) METHOD FOR PLASMA TREATING AND PLASMA NITRIDING GATE OXIDES

(75) Inventors: Juing-Yi Cheng, Kaoshung County (TW); Tze-Liang Lee, Hsinchu (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/267,955

(22) Filed: Oct. 9, 2002

(51) Int. Cl.[7] .............................................. H01L 21/31

(52) U.S. Cl. ...................... 438/775; 438/197; 438/287; 438/591; 438/788; 438/792

(58) Field of Search .............................. 438/197, 216, 438/287, 261, 513, 585, 591, 761, 762, 769, 771, 772, 773, 775, 776, 777, 778, 787, 788, 792

(56) References Cited

U.S. PATENT DOCUMENTS

| | | | | |
|---|---|---|---|---|
| 6,136,654 A | * | 10/2000 | Kraft et al. | 438/287 |
| 6,245,616 B1 | * | 6/2001 | Buchanan et al. | 438/287 |
| 2002/0197880 A1 | * | 12/2002 | Niimi et al. | 438/763 |

* cited by examiner

*Primary Examiner*—Jack Chen
(74) *Attorney, Agent, or Firm*—Tung & Associates

(57) ABSTRACT

A method for forming a nitrided gate oxide over a silicon substrate in a semiconductor device fabrication process including providing a silicon semiconductor substrate; thermally growing a gate oxide layer including silicon dioxide over the silicon substrate; plasma treating the gate oxide layer including a plasma supplied with a plasma source gas including at least one of helium, hydrogen, deuterium, and oxygen; plasma nitriding the gate oxide layer according to a plasma treatment including a plasma supplied with a plasma source gas including nitrogen; and, thermally annealing the silicon semiconductor substrate including the gate oxide layer according to at least one annealing treatment.

17 Claims, 1 Drawing Sheet

METHOD FOR PLASMA TREATING AND PLASMA NITRIDING GATE OXIDES

FIELD OF THE INVENTION

The present invention relates generally to CMOS device fabrication processes and, more particularly, to a method of manufacturing gate structures particularly a method for forming nitrided gate oxides having improved electrical properties including leakage current and improved charge mobility.

BACKGROUND OF THE INVENTION

Fabrication of a metal-oxide-semiconductor (MOS) integrated circuit involves numerous processing steps. A gate dielectric, typically formed from silicon dioxide, is formed on a semiconductor substrate which is doped with either n-type or p-type impurities. For each MOS field effect transistor (MOSFET) being formed, a gate electrode is formed over the gate dielectric, and dopant impurities are introduced into the semiconductor substrate to form source and drain regions. Many modern day semiconductor microelectronic fabrication processes form features having less than 0.25 critical dimensions, for example more recent devices include features sizes of less than 0.13 microns. As feature size decreases, the size of the resulting transistor as well as transistor features also decrease. Fabrication of smaller transistors allows more transistors to be placed on a single monolithic substrate, thereby allowing relatively large circuit systems to be incorporated on a single die area.

In semiconductor microelectronic device fabrication, polysilicon and silicon dioxide ($SiO_2$) are commonly used to respectively form gate electrodes and gate dielectrics for metal-oxide-semiconductor (MOS) transistors. As device dimensions have continued to scale down, the thickness of the $SiO_2$ gate dielectric layer has also decreased to maintain the same capacitance between the gate and channel regions. A thickness of the gate oxide layer of less than 2 nanometers (nm) will be required to meet smaller device design constraints. A problem with using $SiO_2$ as the gate dielectric is that thin $SiO_2$ oxide films may break down when subjected to electric fields expected in some operating environments, particularly for gate oxides less than about 50 Angstroms thick. In addition, electrons more readily pass through an insulating gate dielectric as it gets thinner due to what is frequently referred to as the quantum mechanical tunneling effect. In this manner, a tunneling current, produces a leakage current passing through the gate dielectric between the semiconductor substrate and the gate electrode, increasingly adversely affecting the operability of the device. For example, as current leakages increase the gate oxide is no longer completely capacitive and has a resistive component. As a result, the device will require a large amount of standby power, diminishing the commercial value of a device. Related to the current leakage problem in thin gate oxides, is the formation of trapping states and interfacial charged states at the silicon/gate dielectric interface which increasingly adversely affects device electrical characteristics. For example, as the trapped charges accumulate over time, the threshold voltage $V_T$ may shift from its design specification.

Because of high direct tunneling currents, $SiO_2$ films thinner than about 1.5 nm cannot be reliably used as the gate dielectric in CMOS devices. One method to counteract the effects of leakage current has been to incorporate nitrogen into the gate oxide, to increase the effective dielectric constant of the gate oxide therefore allowing a relatively thicker nitrogen doped gate oxide to be formed with a capacitance comparable to a relatively thinner $SiO_2$ gate oxide. One approach in the prior art has included plasma nitriding (nitridation) methods whereby nitrogen ions are implanted into the surface of the gate oxide after forming a thin thermally grown $SiO_2$ layer, for example about 50 Angstroms to about 150 Angstroms. Other methods of nitriding of the gate oxide have additionally been proposed including thermally growing gate oxides in the presence of ammonia ($NH_3$) or in the presence of nitrous oxide ($N_2O$) in a rapid thermal oxidation (RTO) process. Through the provision of an $NH_3$ ambient during oxide growth, nitrogen can be incorporated at concentration levels up to about 10 wt % while growing oxides in an $N_2O$ ambient results in a lower wt % nitrogen incorporated into the gate oxide, for example about 1 to about 2 wt %. A shortcoming of using $NH_3$ as a ambient for nitriding is the presence of hydrogen in the gate oxide creating electron trapping sites which can increase current leakage. A shortcoming of the using $N_2O$ as an ambient for nitriding is the limited amount of nitrogen that can be incorporated into the gate oxide.

Another advantage of nitriding of gate oxides, for example at the gate oxide/gate electrode interface, is the formation of a diffusion barrier for doped impurities. For example, boron is frequently used for doping polysilicon gate electrodes and tends to diffuse from across the gate oxide into the silicon substrate channel region thereby degrading device performance. An advantage of plasma nitriding has been thought to be the ability to incorporate nitrogen at the gate oxide/gate electrode interface to accomplish both the goals of creating a diffusion barrier and to reduce current leakage by increasing the dielectric constant of the gate oxide thereby allowing the formation of thicker gate oxides dielectrically equivalent to a thinner $SiO_2$ gate oxide, also referred to as a reduced effective oxide thickness (EOT), without the corresponding increase in tunneling (leakage) current. On the other hand, a shortcoming of this approach is the relative lack of nitrogen at the silicon/gate oxide interface which is believed to have the beneficial effect of reducing the level of trapping and interface states which contribute to current leakage. Another shortcoming of the plasma nitriding approach has been the effect of decreased charge mobility in the gate oxide resulting from nonuniform distributions of nitrogen within the gate oxide.

Therefore it would be advantageous to develop an improved method for formation of nitrided gate oxides that both reduces gate oxide current leakage while maintaining charge mobilities for improved device performance.

It is therefore an object of the invention to provide an improved method for formation of nitrided gate oxides that both reduces gate oxide current leakage while maintaining charge mobilities for improved device performance while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for forming a nitrided gate oxide over a silicon substrate in a semiconductor device fabrication process.

In a first embodiment, the method includes providing a silicon semiconductor substrate; thermally growing a gate oxide layer including silicon dioxide over the silicon substrate; plasma treating the gate oxide layer including a plasma supplied with a plasma source gas including at least one of helium, hydrogen, deuterium, and oxygen; plasma nitriding the gate oxide layer according to a plasma treatment including a plasma supplied with a plasma source gas including nitrogen; and, thermally annealing the silicon semiconductor substrate including the gate oxide layer according to at least one annealing treatment.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the formation of an exemplary gate oxide, it will be appreciated that the method of the present invention may be adapted for the formation of dual thickness gate oxides, for example, gate oxides having varying thicknesses depending on the type of polysilicon gate electrode doping, for example boron or arsenic in the formation of, for example, a PMOS or an NMOS transistor. The term "substrate" is defined to mean any semiconductive substrate material including conventional semiconductor wafers.

Figure 1:
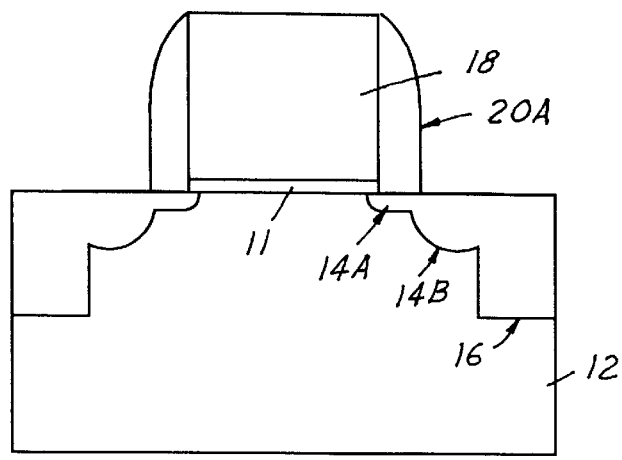
FIG. 1 is a cross sectional side view of an exemplary CMOS transistor according to an exemplary implementation of an embodiment of the present invention.

Referring to FIG. 1 is shown a cross sectional side view of an exemplary CMOS transistor having a gate oxide 11 according to an exemplary implementation of the present invention. Shown is a semiconductor substrate 12, for example a silicon substrate including lightly doped regions e.g., 14A, source/drain regions, e.g., 14B and shallow trench isolation regions, e.g., 16 formed in the silicon substrate by conventional methods known in the art. The regions 14A and 14B are typically formed following the formation of the gate structure by ion implantation and annealing processes known in the art. Typically the ion implantation process is carried out following formation of the gate electrode 18, for example, polysilicon, formed over the gate oxide 11. The gate oxide is preferably grown as one of a pure $SiO_2$ layer and a nitrided $SiO_2$ layer.

Still referring to FIG. 1, the gate structure is typically formed by conventional photolithographic patterning and anisotropic etching steps following polysilicon deposition. Following gate structure formation a first ion implantation process is carried out to form LDD regions e.g., 14A in the silicon substrate and to dope the polysilicon electrode 18. Sidewall spacers e.g., 20A, are formed including for example at least one of silicon oxide (e.g., $SiO_2$), silicon oxynitride (e.g., SiON), and silicon nitride (e.g., SiN) including multiple layered spacers by methods known in the art including conventional deposition and etchback processes. A second ion implantation process is then carried out to form the source/drain regions e.g., 14B in a self aligned ion implantation process where the sidewall spacers e.g., 20A act as an implantation mask to form N type or P type doping regions depending on whether a PMOS or NMOS type device is desired.

Figure 2:
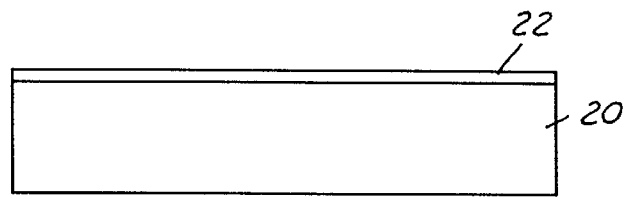
FIG. 2 is a cross sectional side view of a portion of a gate structure including a gate oxide according to an exemplary embodiment of the present invention.

Referring to FIG. 2 is shown a cross sectional side view of a portion of a gate oxide region. Shown is silicon substrate 20 and gate oxide 22 thermally grown over the silicon substrate. In a one embodiment of the present invention, the silicon substrate 20 is cleaned prior to the formation of the overlying gate oxide layer 22. Preferably, the silicon substrate is cleaned using standard cleaning 1 (SC-1) and/or standard cleaning-2 (SC-2) solutions, which may be individually or sequentially used cleaning solutions including mixtures of NH4OH-H2O2-H2O, and HCL-H2O2-H2O, respectively.

In one embodiment, a gate oxide 22 of silicon dioxide ($SiO_2$) is grown by conventional methods over the silicon substrate 20 to a thickness of about 5 Angstroms to about 30 Angstroms, more preferably about 5 to about 20 Angstroms. For example, the growth process can take place in a reduced pressure oxygen ambient, for example from about 0.01 atm to about 1 atm. Alternatively, an oxygen ambient can be diluted with an inert gas such as argon or nitrogen from about 5% by volume to about 15% by volume. The gate oxide growth process may suitably include a dry oxide growth process or an ISSG process (in-situ-stem generated) process and may include a rapid thermal oxidation (RTO) process or a furnace oxidation process. For example, the gate oxide growth process is suitably performed at temperatures from about 850° C. to about 1050° C. depending on the process.

In another embodiment, a thermally grown nitrided gate oxide is formed by conventional methods preferably having a thickness of about 5 Angstroms to about 30 Angstroms, more preferably, about 5 Angstroms to about 20 Angstroms. Preferably, the nitrided gate oxide is grown in an atmosphere including oxygen and at least one of nitric oxide (NO) and nitrous oxide ($N_2O$) in a parallel oxidation/nitriding (nitridation) process by conventional methods known in the art to achieve a nitrogen concentration of about 0.5 wt % to about 2 wt %. Optionally, a conventional thermally grown $SiO_2$ gate oxide or nitrided $SiO_2$ gate oxide is followed by a conventional nitriding (nitridation) annealing process in an ambient including at least one of $NH_3$, NO and $N_2O$. The nitriding annealing process is less preferred since the incorporation of nitrogen into the gate oxide is less uniformly distributed compared to a parallel oxidation/nitriding process. In addition, the use of $NH_3$ is less preferred since residual hydrogen formed in the gate oxide is believed to increase electron trapping which is detrimental to device performance. Preferably, the concentration of nitrogen incorporated into the gate oxide following a nitriding annealing process is less than about 5 wt %. The preferred wt % is together with subsequent processes achieves a nitrogen distribution with optimized charge mobility and current leakage characteristic of acceptable device performance.

Following the gate oxide formation, in one embodiment, according to the present invention the gate oxide is subjected to a plasma nitriding treatment. Preferably, the plasma nitriding treatment is carried out with an RF power of about 100 Watts to about 1000 Watts, more preferably, about 200 Watts to about 600 Watts. In one embodiment, the plasma nitriding treatment is preferably carried out at low pressures, for example from about 1 milliTorr to about 100 milliTorr. The plasma nitriding treatment in another embodiment preferably includes a pre-heating step to degas the process wafer including the gate oxide prior to the plasma treatment where the substrate is heated to about 300° C. to 400° C., more preferably about 350° C. for about 60 seconds to about 180 seconds. In a first step the plasma nitriding treatment is preferably carried out at a pressure of from about 1 milliTorr to about 50 milliTorr, more preferably from about 3 milliTorr to about 20 milliTorr. Individually fed or a premixed mixture of plasma source gas is supplied to ignite and maintain the plasma. The plasma source gas preferably includes nitrogen ($N_2$) at a volumetric concentration of about 50% to about 100% with respect to the total volume of the plasma source gas. The plasma source gas preferably includes an inert gas, preferably, helium, to make up a remaining volume percent, if any, of the plasma source gas volume. The plasma nitriding treatment is preferably carried out for a period of about 20 seconds to about 200 seconds, most preferably about 60 to about 180 seconds. In one embodiment, the total weight percent of nitrogen in the gate oxide following the plasma nitridation step is between about 3 weight percent and about 9 weight percent.

Optionally, an RF bias is applied to the process wafer at a power level of about 100 Watts to about 400 Watts to assist in adjusting a negative DC self-bias voltage developed between the plasma and the process wafer, for example between about –100 Volts and –250 Volts. It will be appreciated that the magnitude of the self-bias voltage will depend on the electrode areas and amplitudes of the RF power and RF bias. For example, it has been found that an RF bias can have a beneficial effect with respect to nitrogen penetration into the gate oxide surface by enhancing plasma ion surface bombardment momentum.

In another embodiment, a surface preparation plasma treatment is optionally performed on the gate oxide prior to the plasma nitriding treatment of the gate oxide. Preferably, the surface preparation plasma treatment process includes a plasma source gas including helium, for example preferably from about 50 volume % to about 100 volume % of the total volume of the plasma source gas. However, other plasma source gases including, hydrogen ($H_2$), oxygen ($O_2$), or deuterium ($D_2$) gases may be used in addition to helium or as an alternative plasma source gas. Hydrogen and deuterium are less preferred since it is believed residual hydrogen in the gate oxide contributes to the formation of electron traps which degrade device performance. Helium is preferred due to its inertness and lower momentum transfer during plasma processing believed to result in a lower level of plasma damage compared to other plasma gas sources. The preferred plasma process conditions for the surface preparation plasma treatment process are the same as those detailed with respect to the plasma nitriding treatment process.

Although the precise reason is unknown, the surface preparation plasma treatment, preferably a helium plasma, has been found to have a beneficial effect with respect to a subsequently performed plasma nitriding process according to preferred embodiment of the present invention. The beneficial effect is believed to be related to altering gate oxide surface properties including densification of the gate oxide and providing for more effective nitrogen penetration in a subsequent plasma nitriding process.

Following the plasma nitriding process, the process wafer including the gate oxide is subjected to an optional post plasma nitriding plasma treatment. For example it has been found that a plasma treatment following plasma nitriding together with associated processing steps improves the gate oxide electrical performance compared to conventional nitriding processes including an increased charge mobility, and reduced current leakage, thereby achieving a reduced equivalent $SiO_2$ gate oxide thickness (EOT). It is believed that the post plasma nitriding plasma treatment improves the distribution uniformity of the nitrogen implanted during the plasma nitriding process by an atomic collision and locally thermally activated process. For example, it is believed the post plasma nitriding plasma treatment additionally increases the effectiveness of subsequently performed thermal annealing steps to increase the uniformity of nitrogen distribution within the gate oxide and to optimize nitrogen distribution at the silicon/gate oxide interface.

Following the plasma nitriding treatment optionally including the post plasma nitriding plasma treatment, the process wafer including the gate oxide is subjected to at least one annealing treatment, preferably a rapid thermal anneal (RTA) at a temperature of about 900° C. to about 100° C. in an oxygen containing atmosphere for about 30 seconds to about 180 seconds. More preferably, the annealing treatment includes a low temperature anneal followed by a high temperature anneal. Preferably, the low temperature anneal is carried out at a temperature of about 400° C. to about 600° C. in an oxygen containing atmosphere for about 1 minute to about 5 minutes followed by a high temperature anneal, preferably a rapid thermal anneal (RTA) at a temperature of about 900° C. to about 100° C. in an oxygen containing atmosphere for about 30 seconds to about 120 seconds. It is believed the post plasma nitriding annealing treatment operates to anneal out plasma damage and more uniformly distribute the nitrogen introduced into the gate oxide during the plasma nitridation to achieve improved charge mobility and is believed to optimize a nitrogen distribution at the silicon/gate oxide interface to reduce electron trapping thereby improve device electrical performance.

Figure 3:
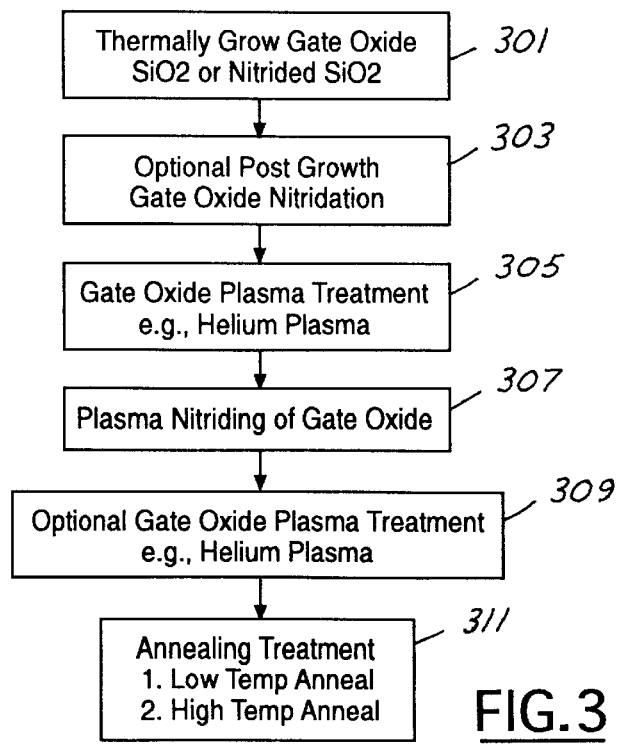
FIG. 3 is a process flow diagram including several embodiments of the present invention.

Referring to FIG. 3 is a process flow diagram including several embodiments of the present invention. In a first process 301 an gate oxide layer having a thickness of about 5 Angstroms to about 20 Angstroms is thermally grown over a silicon substrate in the presence of at least one of oxygen ($O_2$), nitric oxide (NO) and nitrous oxide ($N_2O$) ambient to form one of an $SiO_2$ gate oxide layer and a nitrided $SiO_2$ gate oxide layer. In process 303, an optional post nitriding annealing process of the gate oxide layer is carried out in the presence of at least one of nitric oxide (NO), nitrous oxide ($N_2O$), and ammonia ($NH_3$) ambient. In process 305, a surface preparation plasma treatment of the gate oxide layer is carried out with a plasma gas source preferably including helium, but at least one of helium, hydrogen, deuterium, and oxygen, according to preferred embodiments. In process 307, a plasma nitriding treatment of the gate oxide layer is carried out according to preferred embodiments. In process 309, an optional post plasma nitriding plasma treatment of the gate oxide layer is carried out with a plasma gas source preferably including helium, but at least one of helium, hydrogen, deuterium, and oxygen, according to preferred embodiments. In process 311 a post plasma nitriding annealing treatment including at least a high temperature treatment is carried out but preferably including a low temperature treatment followed by a high temperature treatment.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A method for forming a nitrided gate oxide over a silicon substrate in a semiconductor device fabrication process comprising the steps of:

providing a silicon substrate;

thermally growing a gate oxide layer comprising silicon dioxide over the silicon substrate;

plasma treating the gate oxide layer in a first plasma treatment step comprising a plasma consisting essentially of a plasma source gas selected from the group consisting of helium, hydrogen, deuterium, and oxygen;

plasma nitriding the gate oxide layer in a second plasma treatment step after the first plasma treatment step, wherein the second plasma treatment step comprises a plasma supplied with a plasma source gas including nitrogen; and, thermally annealing the silicon substrate including the gate oxide layer according to at least one annealing treatment.

2. The method of claim 1, wherein the gate oxide layer is thermally grown in an oxygen containing atmosphere including at least one of nitric oxide (NO) and nitrous oxide ($N_2O$).

3. The method of claim 2, wherein the gate oxide layer comprises nitrogen from about 0.5 weight percent to about 2 weight percent.

4. The method of claim 1, wherein the gate oxide layer is thermally grown to a thickness of about 5 Angstroms to about 30 Angstroms.

5. The method of claim 1, wherein the step of thermally annealing comprises a low temperature anneal at about 400° C. to about 600° C. followed by a high temperature anneal at a temperature of about 900° C. to about 1000° C.

6. The method of claim 5, wherein the low temperature anneal is carried out for a period of about 1 minute to about 5 minutes and the high temperature anneal is carried out for a period of about 30 seconds to about 120 seconds.

7. The method of claim 5, wherein at least one of the low temperature anneal and high temperature anneal are carried out in an oxygen containing atmosphere.

8. The method of claim 5, wherein both the low temperature anneal and high temperature anneal are carried out in an oxygen containing atmosphere.

9. The method of claim 1, wherein the steps of plasma treating and plasma nitriding comprise plasma operating conditions comprising a pressure of about 1 milliTorr to about 100 milliTorr, an RF power of about 100 Watts to about 1000 Watts, and a silicon substrate temperature of about 300° to about 400° C.

10. The method of claim 9, wherein the plasma operating conditions comprise a pressure of about 3 milliTorr to about 20 milliTorr, an RF power of about 200 Watts to about 600 Watts, and a silicon substrate temperature of about 300° C. to about 400° C.

11. The method of claim 10, wherein the steps of plasma treating and plasma nitriding are carried out for a time period of about 60 seconds to about 180 seconds.

12. The method of claim 9, wherein an RF bias is applied to the silicon substrate to adjust a negative DC bias between the plasma and the silicon substrate.

13. The method of claim 1, wherein the step of plasma treating comprises a plasma gas source consisting essentially of helium.

14. The method of claim 1, wherein the step of plasma treating comprises a plasma gas source comprising from about 50 to about 100 volume percent of the plasma gas source.

15. The method of claim 1, wherein the step of plasma treating comprises plasma operating conditions comprising a pressure of about 1 milliTorr to about 100 milliTorr, an RF power of about 100 Watts to about 1000 Watts, and a silicon substrate temperature of about 300° C. to about 400° C.

16. The method of claim 15, wherein an RF bias is applied to the silicon substrate to adjust a negative DC bias between the plasma and the silicon substrate.

17. The method of claim 1, wherein the gate oxide layer consists essentially of silicon dioxide.

* * * * *